United States Patent
Furutani et al.

(10) Patent No.: US 9,510,450 B2
(45) Date of Patent: Nov. 29, 2016

(54) PRINTED WIRING BOARD AND METHOD FOR MANUFACTURING THE SAME

(71) Applicant: IBIDEN CO., LTD., Ogaki (JP)

(72) Inventors: Toshiki Furutani, Ogaki (JP); Yasushi Inagaki, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/799,887

(22) Filed: Jul. 15, 2015

(65) Prior Publication Data

US 2016/0021759 A1 Jan. 21, 2016

(30) Foreign Application Priority Data

Jul. 15, 2014 (JP) .................... 2014-145434

(51) Int. Cl.

| H05K 1/09 | (2006.01) |
|---|---|
| H05K 1/11 | (2006.01) |
| H05K 3/00 | (2006.01) |
| H05K 3/06 | (2006.01) |
| H05K 3/10 | (2006.01) |
| H05K 1/02 | (2006.01) |
| H05K 3/40 | (2006.01) |

(52) U.S. Cl.
CPC .......... *H05K 1/115* (2013.01); *H05K 1/0296* (2013.01); *H05K 1/111* (2013.01); *H05K 3/0011* (2013.01); *H05K 3/0017* (2013.01); *H05K 3/061* (2013.01); *H05K 3/103* (2013.01); *H05K 3/4038* (2013.01); *H05K 2203/0384* (2013.01)

(58) Field of Classification Search
CPC ........ H05K 1/09; H05K 1/115; H05K 1/116; H05K 3/0011; H05K 3/061
See application file for complete search history.

(56) References Cited

U.S. PATENT DOCUMENTS

| 2003/0045024 A1 | 3/2003 | Shimoto et al. |
| 2005/0130413 A1 | 6/2005 | Shimoto et al. |
| 2010/0193949 A1* | 8/2010 | Belanger et al. ............. 257/738 |
| 2015/0257262 A1* | 9/2015 | Lee et al. ............. H05K 1/0346 |

FOREIGN PATENT DOCUMENTS

JP 2002-198462 A 7/2002

OTHER PUBLICATIONS

U.S. Appl. No. 14/799,860, filed Jul. 15, 2015, Furutani, et al.

* cited by examiner

*Primary Examiner* — Jeremy C Norris
(74) *Attorney, Agent, or Firm* — Oblon, McClelland, Maier & Neustadt, L.L.P.

(57) ABSTRACT

A printed wiring board includes a insulation layer, a first conductive layer embedded into first surface of the insulation layer and having surface exposed on the first surface of the insulation layer, a second conductive layer formed on second surface of the insulation layer and protruding from the second surface of the insulation layer, a via penetrating through the insulation layer and electrically connecting the first and second conductive layers, a solder-resist layer covering the first conductive layer and having an opening structure forming an exposed structure of the first conductive layer, and a metal layer formed on the exposed structure and protruding from the first surface of the insulation layer. The exposed structure of the first conductive layer includes pads positioned to mount an electronic component to the first conductive layer, and the metal layer has a solder layer formed on the metal layer and having a flat surface.

20 Claims, 6 Drawing Sheets

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2014-145434, filed Jul. 15, 2014, the entire contents of which are incorporated herein by reference.

BACKGROUND OF THE INVENTION

Field of the Invention

The present invention relates to a printed wiring board for mounting an electronic component and its manufacturing method. More specifically, the present invention relates to a printed wiring board capable of efficiently making connection with an electronic component and enhancing connection reliability with the mounted electronic component, and to a method for manufacturing such a wiring board.

Description of Background Art

JP2002-198462A describes a wiring board where conductive patterns (electrodes) are embedded near one of the surfaces of an insulation layer while conductive patterns (wiring layer) are formed on the other surface. Solder balls for bonding with a semiconductor chip or the like are formed on the conductive patterns embedded near one of the surfaces of the wiring board. The entire contents of this publication are incorporated herein by reference.

SUMMARY OF THE INVENTION

According to one aspect of the present invention, a printed wiring board includes a resin insulation layer, a first conductive layer formed on a first-surface side of the resin insulation layer such that the first conductive layer is embedded into a first surface of the resin insulation layer and has a surface exposed on the first surface of the resin insulation layer, a second conductive layer formed on a second-surface side of the resin insulation layer such that the second conductive layer is formed on a second surface of the resin insulation layer and is protruding from the second surface of the resin insulation layer, a via conductor formed in the resin insulation layer such that the via conductor is penetrating through the resin insulation layer and electrically connecting the first conductive layer and the second conductive layer, a solder-resist layer formed on the first surface of the resin insulation layer such that the solder-resist layer is covering the first conductive layer and has an opening structure forming an exposed structure of the first conductive layer, and a metal layer formed on the exposed structure of the first conductive layer such that the metal layer is protruding from the first surface of the resin insulation layer. The exposed structure of the first conductive layer includes pads positioned to mount an electronic component to the first conductive layer, and the metal layer has a solder layer formed on the metal layer and having a flat surface.

According to one aspect of the present invention, a method for manufacturing a printed wiring board includes forming a first conductive layer on a metal layer formed on an entire surface of a carrier such that the first conductive layer has pads positioned to mount an electronic component, laminating a resin insulation layer and a metal foil on the metal layer such that the resin insulation layer covers the first conductive layer, forming a hole for a via conductor in the resin insulation layer such that the hole penetrates through the metal foil and the resin insulation layer and exposes a portion of the first conductive layer, forming a second conductive layer including the metal foil such that the hole is filled with a conductive material, removing the carrier from the metal layer such that a surface of the metal layer is exposed, forming a solder layer on the metal layer positioned on the pads of the first conductive layer, etching away a portion of the metal layer by using the solder layer as a mask, and forming a solder-resist layer on the first surface of the resin insulation layer such that the solder-resist layer has an opening structure forming an exposed structure including the pads of the first conductive layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
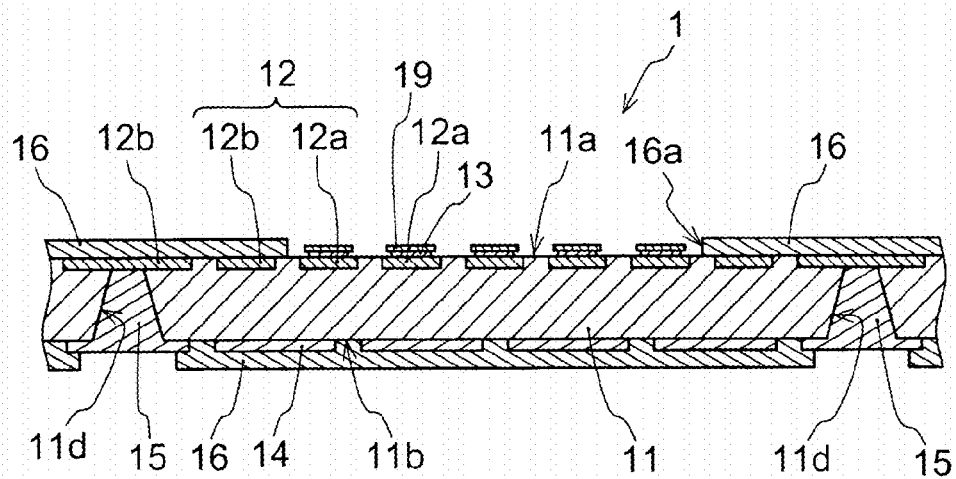
FIG. 1 is a cross-sectional view showing a printed wiring board according to an embodiment of the present invention.

The embodiments will now be described with reference to the accompanying drawings, wherein like reference numerals designate corresponding or identical elements throughout the various drawings.

A printed wiring board according to an embodiment of the present invention is described with reference to the accompanying drawings. FIG. 1 shows printed wiring board 1 of the present embodiment. Printed wiring board 1 is provided with resin insulation layer 11 having first surface (11a) and its opposing second surface (11b); first conductive layer 12 embedded to expose a surface on first surface (11a); and second conductive layer 14 formed to protrude from second surface (11b) of resin insulation layer 11, namely, to be laminated on second surface (11b). In addition, via conductors 15 are formed, penetrating through resin insulation layer 11 and electrically connecting first conductive layer 12 and second conductive layer 14; and solder-resist layer 16 is formed on first surface (11a) of resin insulation layer 11 and on first conductive layer 12. First conductive layer 12 includes first patterns (12a) onto which electronic component 30 (see FIG. 7H) is electrically connected. In solder-resist layer 16, opening (16a) is formed to expose first patterns (12a) as pads for mounting an electronic component. On first patterns (12a) of first conductive layer 12 exposed through opening (16a), metal layer 13 is formed to protrude from first surface (11a) of resin insulation layer 11. Solder layer 19 is formed on metal layer 13. The surface of solder layer 19 opposite metal layer 13 is formed substantially flat as shown in FIG. 1.

Resin insulation layer 11 has first surface (11a) and second surface (11b) opposite first surface (11a). Resin insulation layer 11 may be formed, for example, by impregnating a core material such as glass fiber with a resin composition that contains filler. Alternatively, resin insulation layer 11 may be formed using only a resin composition that contains filler, or may be formed using a resin composition that does not contain filler, whether or not it is impregnated into a core material. Resin insulation layer 11 may be single-layered or multilayered. When resin insulation layer 11 is formed with multiple insulation layers, it is easier to adjust its thermal expansion coefficient, flexibility and thickness, for example. An example of the resin material is epoxy resin. The thickness of resin insulation layer 11 is 25~100 µm, for example. First conductive layer 12 is exposed on first surface (11a). On first surface (11a) of resin insulation layer 11, solder-resist layer 16 is formed to have opening (16a) that exposes a region of first patterns (12a) for mounting electronic component 30 (see FIG. 7H). As shown in FIG. 1, in addition to first patterns (12a) for mounting an electronic component, first conductive layer 12 also includes second patterns (12b), which are covered by solder-resist layer 16.

First conductive layer 12 is embedded in resin insulation layer 11, exposing a surface to be made substantially flush with first surface (11a) of resin insulation layer 11. When first conductive layer 12 is embedded in resin insulation layer 11, adhesiveness is enhanced between first conductive layer 12 and resin insulation layer 11. First conductive layer 12 includes portions for connection with electrodes 31 of electronic component 30 (see FIG. 7H) and other portions as described above. In FIG. 1, portions for connection with an electronic component are shown as first patterns (12a) and the rest are shown as second patterns (12b). An example of electronic component 30 is a semiconductor element such as an IC chip. The method for forming first conductive layer 12 is not limited specifically, but electroplating is preferred, since it is a simple and inexpensive method. As the material for forming first conductive layer 12, copper is most likely to be used because copper has excellent conductivity and makes it easier to perform electroplating. However, that is not the only option, and first conductive layer 12 may be made of any other conductive material. The thickness of first conductive layer 12 is not limited specifically, and may be set at approximately 3~12 µm, for example, because such a thickness is formed in a relatively short period of time while uniform conductivity is achieved.

Of the patterns formed in first conductive layer 12, metal layer 13 is formed on first patterns (12a) exposed in opening (16a) of solder-resist layer 16. Regarding metal layer 13 and first patterns (12a) on which metal layer 13 is formed, their size and positional relationships will be described later. The material of metal layer 13 is not limited specifically, as long as it is a metal capable of electrically connecting first patterns (12a) of first conductive layer 12 and electronic component 30 (see FIG. 7H). Copper foil or nickel foil is preferably used for metal layer 13, since they are inexpensive, low in electrical resistance and easy to form layers. Metal layer 13 may be single-layered or multilayered. If metal layer 13 is multilayered, a laminated structure is employed using various materials, for example, Cu/Ni, Cu/Ti, Au/Pd/Ni or Au/Ni.

As shown in FIG. 1, first conductive layer 12 is embedded in resin insulation layer 11 to expose a surface on first surface (11a), whereas second conductive layer 14 is formed on second surface (11b) of resin insulation layer 11 to protrude from the second surface. Accordingly, solder-resist layer 16 on first surface (11a) and solder-resist layer 16 on second surface (11b) are likely to have different thicknesses, because a solder-resist layer is generally formed to have a predetermined thickness measured on the surface of a conductive layer to obtain desired insulation. When solder-resist layers 16 with different thicknesses are formed respectively on both surfaces of resin insulation layer 11, printed wiring board 1 tends to warp during the procedure for mounting electronic component 30 (see FIG. 7H) or according to ambient temperature change when it is installed and used in an electronic device. If first patterns (12a) are formed only with first conductive layer 12, portions except for those exposed on the surface of first conductive layer 12 are covered by resin insulation layer 11. Thus, when printed wiring board 1 warps, stress is exerted on bonded portions of electronic component 30 and first conductive layer 12. Accordingly, repeated temperature changes may further progress deterioration of bonded portions. By contrast, if metal layer 13 is formed to protrude from first surface (11a) of resin insulation layer 11, metal layer 13 is not completely confined by resin insulation layer 11. Therefore, when stress is exerted on bonded portions due to warping in printed wiring board 1, metal layer 13 is capable of mitigating such stress by expanding/contracting in response to warping of printed wiring board 1. As a result, connection reliability with an electronic component is enhanced.

The thickness of metal layer 13 is not limited specifically as long as it is sufficient to mitigate the stress exerted on the portions bonded with electronic component 30 when printed wiring board 1 warps. The thickness of metal layer 13 is made thinner than that of solder-resist layer 16, for example, approximately 1~5 μm, preferably 1.5~3 μm. Setting the thickness of metal layer 13 to be thinner than that of solder-resist layer 16 is preferable, since stress at bonded portions is mitigated without increasing the entire thickness of printed wiring board 1.

Solder layer 19 is connected to first patterns (12a) of first conductive layer 12 through metal layer 13. Thus, by positioning electrodes 31 of electronic component 30 (see FIG. 7H) on solder layer 19 and by applying heat on printed wiring board 1 at a temperature at or higher than the melting point of solder layer 19, electrodes 31 of electronic component 30 are bonded to metal layer 13 using melted solder layer 19 as bonding material, while simultaneously being electrically connected to first conductive layer 12. Namely, electronic component 30 is mounted on printed wiring board 1 without forming solder balls, or supplying bonding material such as solder paste, onto metal layer 13 or first patterns (12a).

The method for forming solder layer 19 is described later. Solder layer 19 is formed by plating, for example, and unlike solder balls, the layer is formed to have a substantially flat upper surface (the surface opposite metal layer 13) as shown in FIG. 1. It is preferred for bonding material on metal layer 13 to have a flat upper surface unlike the shape of solder balls, because a flat surface ensures steady connection with bump-shaped electrodes of an electronic component during the mounting process.

Solder layer 19 may be formed to have a desired thickness. For example, if solder layer 19 is made thick and its upper surface is positioned higher than the upper surface of solder-resist layer 16 (the surface opposite resin insulation layer 11), even when mounting an electronic component where electrode surfaces are made flush with the main body surface, the main body of the electronic component does not abut solder-resist layer 16. Thus, electrodes of the electronic component and solder layer make steady connection with each other. On the other hand, when solder layer 19 is formed by electroplating, forming thinner solder layer 19 is preferred since plating time is made shorter. Here, when the upper surface of a thinner solder layer 19 is positioned lower than the upper surface of solder-resist layer 16, an electronic component is mounted without facing problems, if electrodes of an electronic component are formed like bump electrodes to protrude from the surface of the main body of the electronic component, or if opening (16a) of solder-resist layer 16 is formed sufficiently greater than the main body of an electronic component. As described, the thickness of solder layer 19 is not limited specifically; however, it is preferred to be 10~30 μm to ensure steady connection with an electronic component and excellent productivity. If solder layer 19 is formed by electroplating, its thickness may be set as desired by adjusting plating time or plating current.

As described later, solder layer 19 may be provided as solder mask (19a) (see FIG. 7F) formed as the etching mask on metal layer (13a), that is, metal layer 13 before being patterned (see FIG. 7F). When solder mask (19a) remains on metal layer 13 after portions not covered by solder mask (19a) are removed by etching, the remaining solder mask (19a) is used as solder layer 19 and works as bonding material. When solder layer 19 is formed as above, theoretically speaking, solder layer 19 is formed directly on metal layer 13 without resulting in any positional shifting from metal layer 13.

Figure 2A:
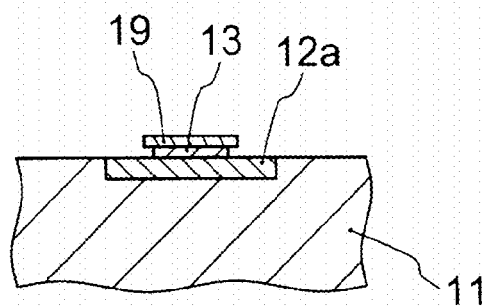
FIG. 2A is a cross-sectional view illustrating the size and positional relationships among a solder layer, metal layer and first pattern.

As shown in FIG. 2A, the side surface of metal layer 13 is positioned inward from the side surface of solder layer 19. Such a structure of solder layer 19 and metal layer 13 is preferred since the distance between adjacent metal layers 13 is wide enough to lower a risk of short circuiting while securing the amount of solder as bonding material when the solder layer is melted during the process for mounting electronic component 30 (see FIG. 7H). Even when the side surface of metal layer 13 is not recessed entirely inward from the side surface of solder layer 19 as shown in FIG. 2A, if at least a portion of the side surface of metal layer 13 is positioned inward from the side surface of solder layer 19, at least the risk of short circuiting with a metal layer adjacent to the portion is lowered.

Figure 2B:
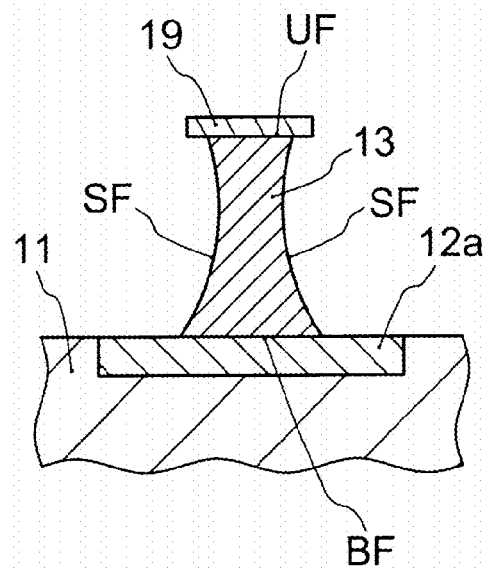
FIG. 2B is a cross-sectional view of an example illustrating the shape of a side surface of the metal layer in FIG. 2A.
Figure 2C:
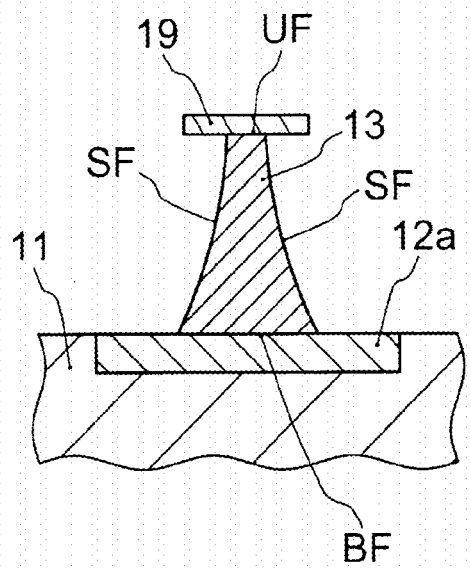
FIG. 2C is a cross-sectional view of another example illustrating the shape of a side surface of the metal layer in FIG. 2A.

The side surface of metal layer 13 may be curved, different from the example shown in FIG. 2A. FIGS. 2B and 2C show examples of metal layer 13 with a curved side surface. FIGS. 2B and 2C each show a view obtained by enlarging only a thickness direction of metal layer 13 to provide an easier grasp of the shape. FIGS. 2B and 2C show examples where side surface (SF) of metal layer 13 positioned to the left and right on the drawings is curved to recede inward. The upper surface (UF) (end surface on the solder layer 19 side) of metal layer 13 is made smaller than lower surface (BF) (end surface on the first pattern (12a) side). In the example shown in FIG. 2B, the narrowest portion of metal layer 13 caused by curved side surface (SF) is positioned between upper surface (UF) and lower surface (BF). In the example shown in FIG. 2C, the width of metal layer 13 increases from upper surface (UF) toward lower surface (BF), making upper surface (UF) the narrowest portion of metal layer 13. When the side surface of metal layer 13 is curved as above, the flexibility of metal layer 13 increases, thus enhancing its capability of mitigating stress exerted on the bonded portions when printed wiring board 1 warps. Moreover, instead of forming the narrowest portion at upper surface (UF) as shown in FIG. 2C, it is preferred to form the narrowest portion between upper surface (UF) and lower surface (BF) as shown in FIG. 2B, because such a structure prevents concentration of stress onto the interface with solder layer 19.

Figure 3:
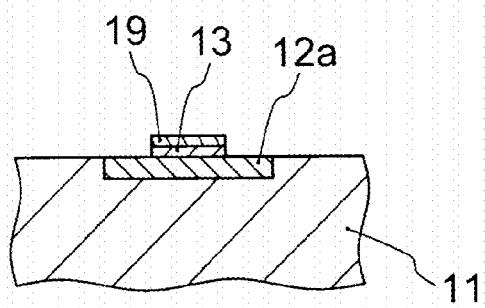
FIG. 3 is a cross-sectional view illustrating the size and positional relationships among a solder layer, metal layer and first pattern.

As described later, when metal layer (13a) is etched using solder mask (19a) as the etching mask (see FIG. 7F), if etching conditions are properly set so as to etch the side surface of metal layer 13 exposed as etching progresses in a thickness direction, or if the thickness of metal layer 13 is selected properly, the side surface of metal layer 13 is formed to recede inward from the side surface of solder layer 19 as shown in FIG. 2A~2C. However, those positional relationships of the side surfaces of metal layer 13 and solder layer 19 are not the only options. For example, as shown in FIG. 3, the side surface of metal layer 13 may be made flush with the side surface of solder layer 19, namely, metal layer 13 and solder layer 19 may be formed to have substantially the same size and substantially the same planar shape.

As shown in FIG. 1, second conductive layer 14 is formed to protrude from second surface (11b) of resin insulation layer 11. The method for forming second conductive layer 14 is not limited specifically. Copper, for example, is used for forming second conductive layer 14. The thickness of second conductive layer 14 is 3~20 μm, for example. Second conductive layer 14 is single-layered in the example shown in FIG. 1, but it may be multilayered with a metal foil and plated metal film as described later.

Via conductors 15 penetrate through resin insulation layer 11 and electrically connect first conductive layer 12 and second conductive layer 14. Via conductor 15 is formed by filling hole (11d) for conductor which penetrates through second conductive layer 14 and resin insulation layer 11. Via conductors 15 are formed by electroplating, for example, using copper as its material, for example.

Figure 7A:
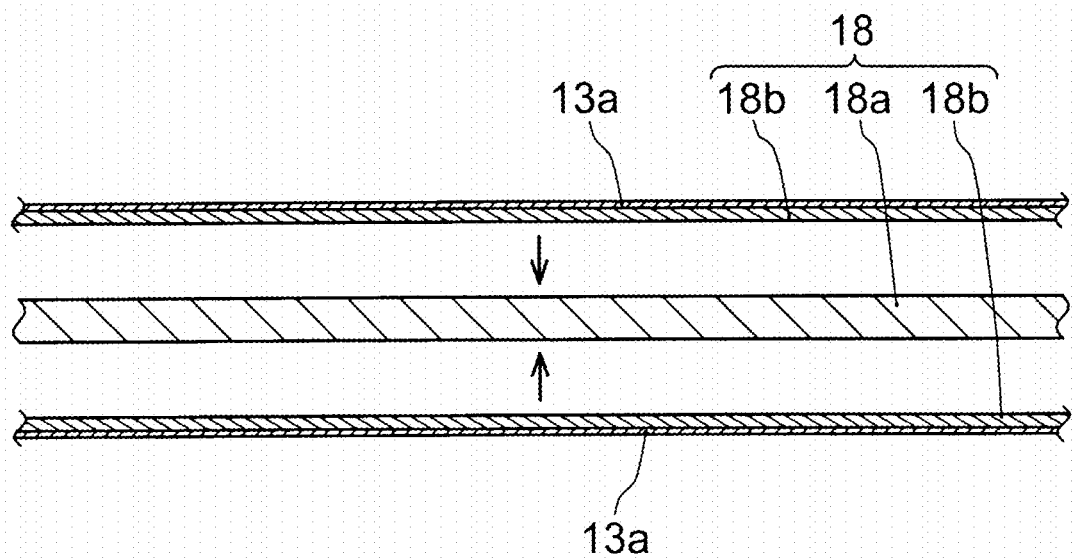
FIG. 7A is a cross-sectional view illustrating a step in a method for manufacturing the printed wiring board shown in FIG. 1.
Figure 7B:
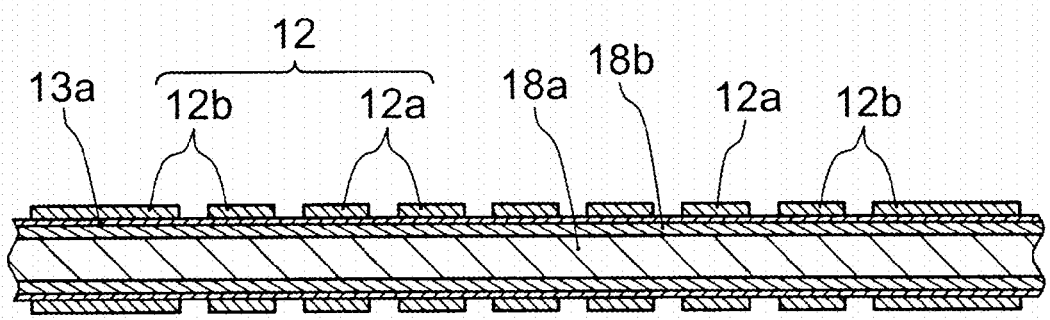
FIG. 7B is a cross-sectional view illustrating a step in the method for manufacturing the printed wiring board shown in FIG. 1.
Figure 7C:
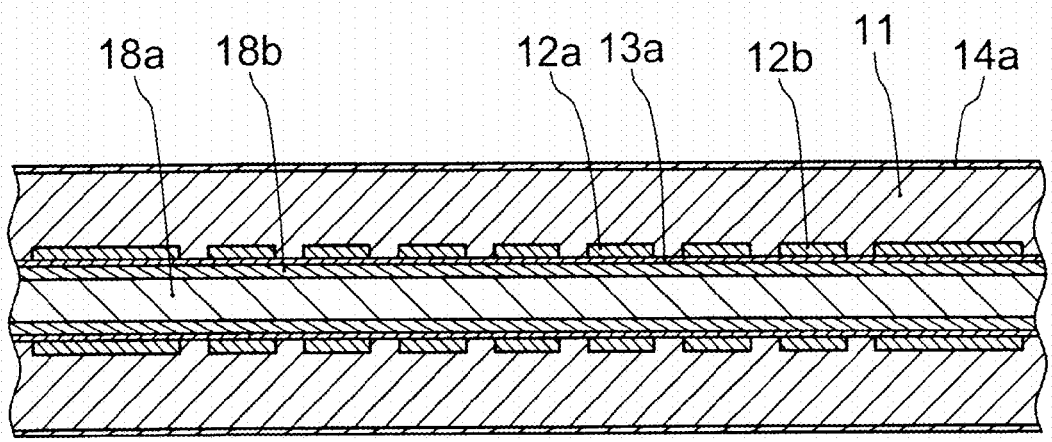
FIG. 7C is a cross-sectional view illustrating a step in the method for manufacturing the printed wiring board shown in FIG. 1.
Figure 7D:
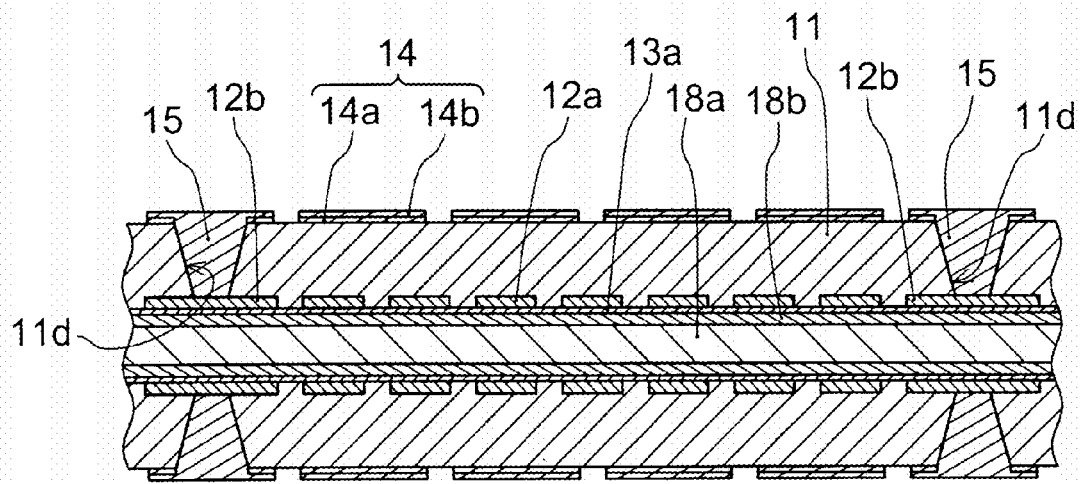
FIG. 7D is a cross-sectional view illustrating a step in the method for manufacturing the printed wiring board shown in FIG. 1.
Figure 7E:
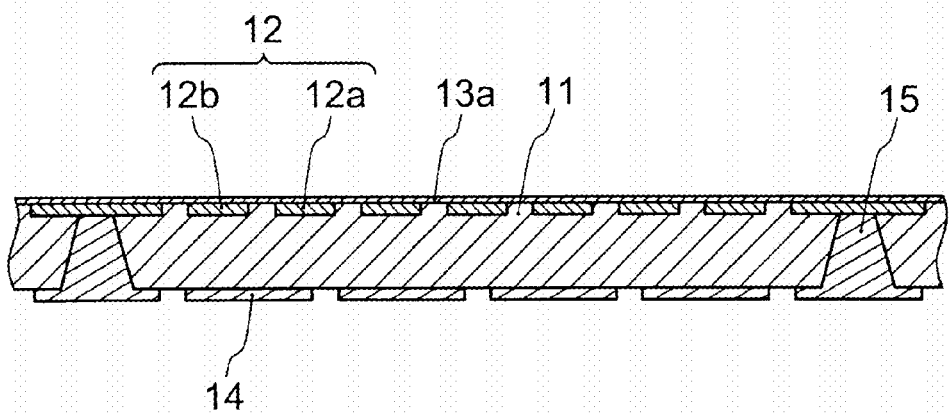
FIG. 7E is a cross-sectional view illustrating a step in the method for manufacturing the printed wiring board shown in FIG. 1.
Figure 7F:
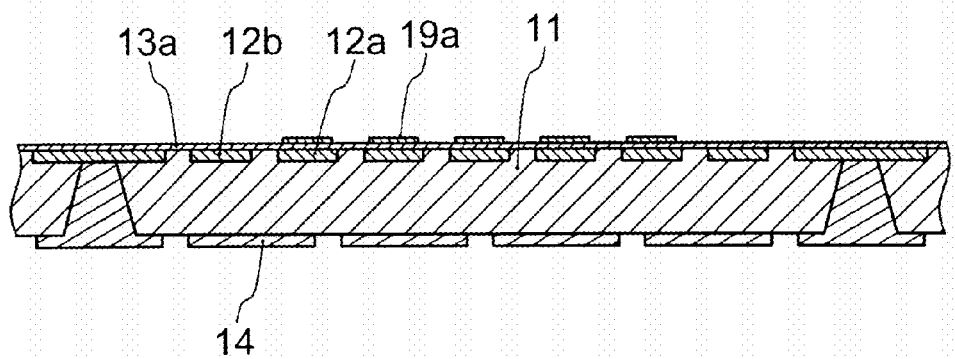
FIG. 7F is a cross-sectional view illustrating a step in the method for manufacturing the printed wiring board shown in FIG. 1.
Figure 7G:
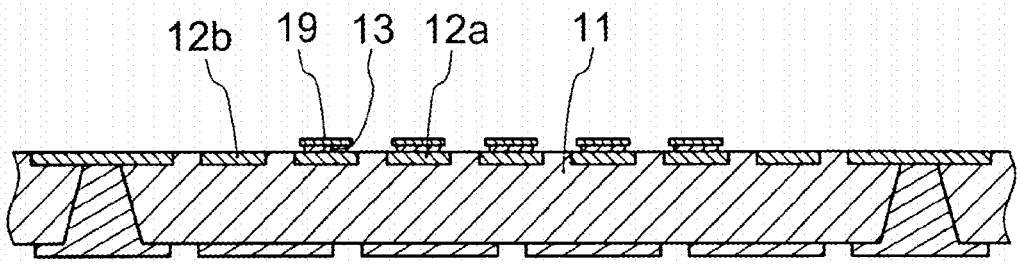
FIG. 7G is a cross-sectional view illustrating a step in the method for manufacturing the printed wiring board shown in FIG. 1.
Figure 7H:
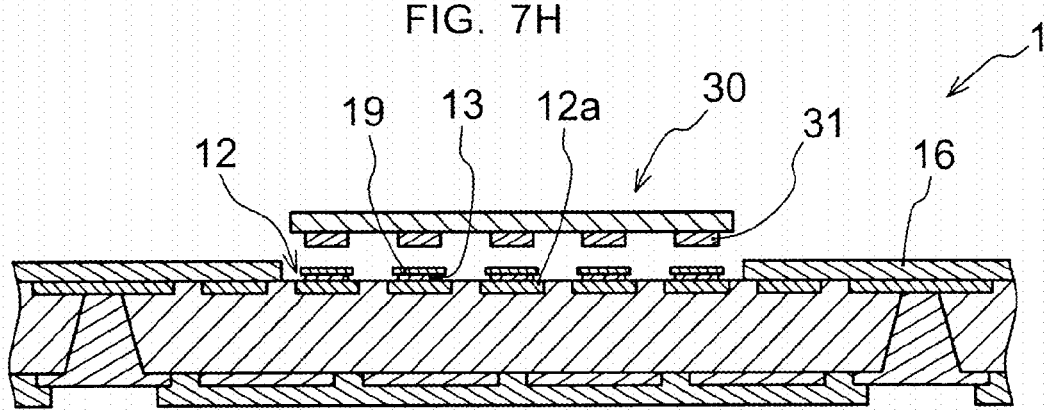
FIG. 7H is a cross-sectional view illustrating a step in the method for manufacturing the printed wiring board shown in FIG. 1.

Solder-resist layer 16 is formed on first surface (11a) of resin insulation layer 11 and on a region of first conductive layer 12 (second patterns (12b)), excluding first patterns (12a) for connection with electrodes 31 of electronic component 30 (see FIG. 7H). In the example shown in FIG. 1, solder-resist layer 16 is positioned to exclude a region of first patterns (12a) and is formed to entirely surround the region, while opening (16a) is formed to expose first patterns (12a) of first conductive layer 12. Opening (16a) may be formed to entirely expose the region of first patterns (12a) as a whole, or individual opening portions may be formed to expose each first pattern (12a) separately. By so setting, electrical insulation is further enhanced between first patterns (12a). The material for forming solder-resist layer 16 is not limited specifically, and thermosetting epoxy resin, for example, may be used. Solder-resist layer 16 is formed to have an approximate thickness of 20 μm.

In printed wiring board 1 of the present embodiment, metal layer 13 is formed on first patterns (12a) of first conductive layer 12 to be connected to electronic component 30 (see FIG. 7H), and solder layer 19 is further formed on metal layer 13. Accordingly, first patterns (12a) of first conductive layer 12 are electrically connected to electronic component 30 through metal layer 13 using solder layer 19 as bonding material. The amount of solder to be used for bonding material is determined by the area and thickness of solder layer 19. Thus, the amount of bonding material is adjustable by modifying the area and thickness of solder layer 19. When solder layer 19 is formed by electroplating, changing the thickness means changing the thickness of solder layer 19 on all first patterns (12a) simultaneously. Thus, if the amount of bonding material needs to be adjusted separately for each first pattern (12a), it is preferred that the amount of bonding material be adjusted by enlarging/reducing the area of each solder layer 19. As described earlier, solder layer 19 is preferred to be formed initially as the etching mask for metal layer (13a) (see FIG. 7F). In such a case, the area of solder layer 19 that affects the amount of bonding material can be adjusted by the area of metal layer 13 on the planar view (hereinafter "area on the planar view" is simply referred to as "size"). If such an adjustment is made by changing the size of first patterns (12a) of first conductive layer 12, the contact area with resin insulation layer 11 is reduced when the area is made smaller, causing a concern over lowered adhesive intensity with resin insulation layer 11. However, since the size of first patterns (12a) is not changed in the present embodiment, the amount of bonding material is adjusted without lowering adhesive intensity.

Examples of size and positional relationships between metal layer 13 and first conductive layer 12 are described with reference to FIGS. 2A and 4~6. As described later, metal layer 13 is obtained when metal layer (13a) is patterned through etching (see FIG. 7F). Thus, to obtain metal layer 13 of a desired size, shape and position, a mask, namely, solder mask (19a) (see FIG. 7F), of a corresponding pattern is formed on metal layer (13a) (see FIG. 7F). Here, it is very difficult to strictly align metal layer 13 and first conductive layer 12, because there are technical limitations on positional accuracy when forming solder mask (19a). However, it is theoretically possible to achieve perfect alignment. FIGS. 2A and 4~6 each show size and positional relationships between metal layer 13 and first conductive layer 12. In the examples shown in FIG. 4~6, metal layer 13 and solder layer 19 are formed so that the side surface of metal layer 13 is positioned inward from the side surface of solder layer 19, the same as in FIG. 2A. However, in size and positional relationships of metal layer 13 and first conductive layer 12 shown in FIG. 4~6, the side surface of metal layer 13 may also be made substantially flush with the side surface of solder layer 19 as shown in FIG. 3. Moreover, metal layer 13 shown in FIG. 3~6 may also have a curved side surface as shown in FIGS. 2A and 2B. Here, plan views are omitted, but the planar shape of metal layer 13 may be any of rectangular, polygonal, circular, and elliptical. In the present application, the width of metal layer 13 indicates the diameter if it is circular, the long side or short side if it is rectangular or polygonal, and the major axis or minor axis if it is elliptical.

In the example shown in FIG. 2A, the width of metal layer 13 is smaller than the width of first pattern (12a) of first conductive layer 12, that is, metal layer 13 is formed not to jut out from first pattern (12a). By so setting, the amount of bonding material provided as solder layer 19 onto metal layer 13 can be adjusted as described above so that it is less than the amount of bonding material supplied onto another metal layer 13 formed to have the same width as that of first pattern (12a).

Figure 4:
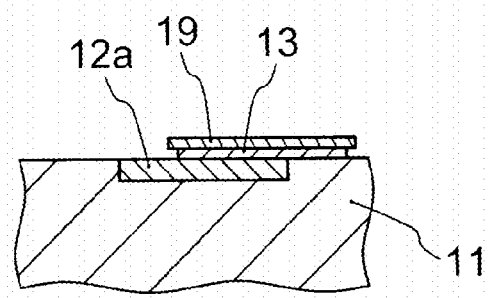
FIG. 4 is a cross-sectional view illustrating the size and positional relationships among a solder layer, metal layer and first pattern.

In the example shown in FIG. 4, the width of metal layer 13 is substantially the same as the width of first pattern (12a), but metal layer 13 is shifted from the position of first pattern (12a). Namely, a portion of metal layer 13 on the first pattern (12a) side is in contact with the surface of first pattern (12a), while another portion of metal layer 13 juts out from first pattern (12a) and extends onto first surface (11a) of resin insulation layer 11. Such shifting does not cause any problem for connecting first pattern (12a) and metal layer 13, and no connection failure occurs between an electronic component and first pattern (12a). Meanwhile, if such minor positional shifting is acceptable, strict alignment is not necessary, and thus the process for forming metal layer 13 is simplified.

Figure 5:
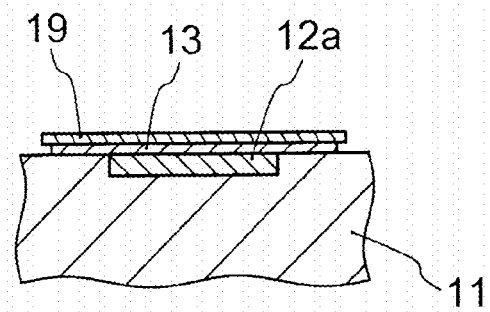
FIG. 5 is a cross-sectional view illustrating the size and positional relationships among a solder layer, metal layer and first pattern.

In the example shown in FIG. 5, the width of metal layer 13 is greater than the width of first pattern (12a). Metal layer 13 covers the entire surface of first pattern (12a). Namely, portions near the periphery of metal layer 13 jut out from first pattern (12a) and extend onto first surface (11a) of resin insulation layer 11. By so setting, the amount of bonding material supplied as solder layer 19 onto metal layer 13 can be adjusted as described above so that the amount is greater than the amount of bonding material supplied onto another metal layer 13 formed to have the same size as that of first pattern 12.

Figure 6:
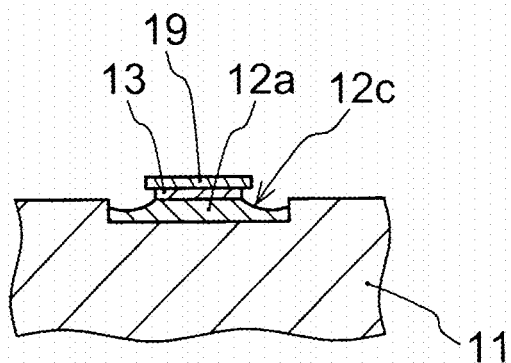
FIG. 6 is a cross-sectional view illustrating the size and positional relationships among a solder layer, metal layer and first pattern.

In the example shown in FIG. 6, a portion of first pattern (12a) is etched so as to be recessed in the peripheral region of metal layer 13. That is because recess (12c) is formed due to over-etching of metal layer 13 when it is patterned. Such recess (12c) does not cause any problem unless first pattern (12a) is etched all the way to its lower surface. Such a structure is preferable in the event of warping of printed wiring board 1, since such a recess creates a longer portion for mitigating stress exerted on a bonded portion and thereby enhances the effects of mitigating stress through expansion/contraction without being confined by resin insulation layer 11 as described earlier.

The size and positional relationships of metal layer 13 and first pattern (12a) are properly selected to achieve the various functions and effects described above.

According to the present embodiment, on first patterns (12a) of first conductive layer 12, which work as pads for mounting an electronic component, metal layer 13 is formed to protrude from first surface (11a) of resin insulation layer 11. Since metal layer 13 expands and contracts without being confined by resin insulation layer 11, stress exerted on the bonded portion with the electronic component is mitigated when printed wiring board 1 warps after the electronic component is mounted. As a result, deterioration of the bonded portion is suppressed, and connection reliability with the electronic component is enhanced.

Also, according to the present embodiment, solder layer 19 is formed on metal layer 13. Thus, it is not necessary to further form solder balls or to supply bonding material on metal layer 13 or the like during the process for mounting an electronic component. Accordingly, the manufacturing process is simplified for an electronic device that uses printed wiring board 1, and manufacturing costs may be lowered.

Figure 8:
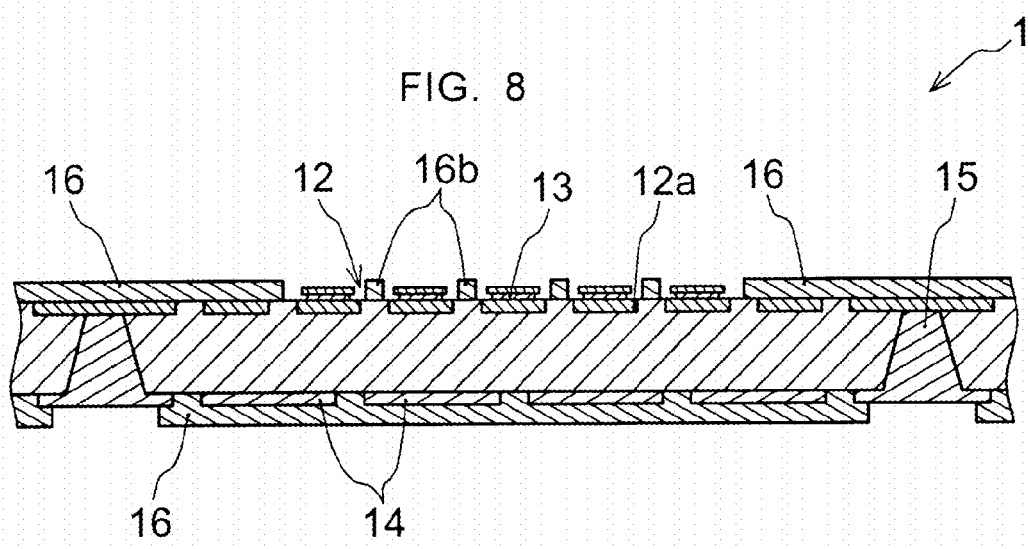
FIG. 8 is a cross-sectional view showing a printed wiring board according to another embodiment of the present invention.

In the present embodiment, solder-resist layer 16 is formed on resin insulation layer 11 by excluding the region of first conductive layer 12 where multiple first patterns (12a) are formed to be adjacent to each other. Namely, solder-resist layer 16 is not formed between the adjacent first patterns (12a). However, to lower the risk of short circuiting caused by solder between adjacent first patterns (12a), it is more preferred to form a solder-resist layer between adjacent first patterns (12a) as well. FIG. 8 shows an example of such a structure. In the embodiment, solder-resist layer (16b) is formed between adjacent first patterns (12a) of first conductive layer 12. By so setting, the risk of short circuiting between first patterns (12a) is lowered. Since the rest in the example shown in FIG. 8 are the same as those in the example shown in FIG. 1, the same reference numeral is assigned to the corresponding portion, and its description is omitted here.

Next, a method for manufacturing a printed wiring board is described according to an embodiment of the present invention by referring to FIG. 7A~7H. When describing the manufacturing method, the same reference numeral is assigned to the corresponding portion described above in the embodiment of printed wiring board 1, and its description is omitted when applicable.

First, carrier 18 with metal layer (13a) formed on its entire surface is prepared as shown in FIG. 7A. Here, metal layer (13a) is patterned as described later: reference numeral (13a) is assigned to the metal layer prior to patterning, and reference numeral 13 is assigned to the patterned metal layer. A copper-clad laminate is used for carrier 18, but that is not the only option. In the example shown in FIG. 1, carrier 18 is formed by laminating carrier copper foil (18b) on both surfaces of support plate (18a); namely, metal layer (13a) with carrier copper foil (18b), for example, is laminated by using an adhesive agent through hot pressing or the like on both surfaces of support plate (18a) made of prepreg, for example. The thickness of metal layer (13a) is 1~5 pin, preferably 1.5~3 μm, and the thickness of carrier metal foil (18b) is 15~30 μm, preferably approximately 18 μm.

The surfaces of metal layer (13a) and carrier metal foil (18b) are entirely adhered or fixed using an easy-to-release adhesive agent such as thermoplastic resin. Since metal layer (13a) and carrier metal foil (18b) are adhered by thermoplastic resin or the like, they are separated easily by applying heat or raising their temperature. However, that is not the only option, and only the peripheries of metal layer (13a) and carrier metal foil (18b) may be adhered or fixed. In such a structure, by cutting off the adhered portion on the periphery, they can be separated easily. Thus, when the peripheries are fixed together, the adhesive agent is not limited to a thermoplastic type.

The material of metal layer (13a) is not limited specifically as long as later described first conductive layer 12 (see FIG. 7B) can be formed on its surface. For example, copper foil or nickel foil, preferably copper foil, is used. The material of carrier metal foil (18b) is not limited specifically. To avoid a different thermal expansion coefficient from that of metal layer (13a), using the same material is preferred; for example, if copper is used for metal layer (13a), carrier metal foil is preferred to be made of copper foil. In addition, a release layer may also be provided on the surface of carrier 18 where metal layer (13a) is formed.

The example shown in FIG. 1 is prepared by adhering carrier metal foil (18b) and metal film (13a) in advance, and then by laminating the obtained metal layer (13a) with carrier metal foil on support plate (18a). Alternatively, the entire surface of the periphery of metal layer (13a) may be adhered to carrier 18, which is formed, for example, by hot pressing metal foil (18b) on support plate (18a). In addition, FIG. 7A~7D show an example where metal layer (13a) is laminated on each of both surfaces of carrier 18. Such a method for manufacturing printed wiring boards 1 is preferred, since first conductive layer 12 (see FIG. 7B) or the like is formed simultaneously on both sides. However, first conductive layer 12 or the like may be formed only on one side of carrier 18, or conductive layers with different circuit patterns may be formed respectively on both surfaces. In the following, an example is described with reference to FIG. 7A~7D to form the same circuit patterns on each of both surfaces. Thus, only one side is used for description purposes. Descriptions and reference numerals on the other side are omitted in each drawing.

Next, as shown in FIG. 7B, first conductive layer 12 is formed to have first patterns (12a), which work as pads for mounting electronic component 30 (see FIG. 7H), and second conductive patterns (12b), which are the rest of the conductive layer. First conductive layer 12 is formed by providing a resist pattern (not shown) to form a predetermined circuit pattern on the surface of metal layer (13a) and by conducting electroplating using metal layer (13a) as an electrode so that plating is deposited in portions where metal layer (13a) is exposed. Then, first conductive layer 12 as shown in FIG. 7B is formed when the resist pattern is removed.

Next, as shown in FIG. 7C, resin insulation layer 11 and metal foil (14a) which makes part of second conductive layer 14 are laminated and hot pressed on first conductive layer 12 and on the exposed surface of metal layer (13a).

Next, as shown in FIG. 7D, holes (11d) for conductor are formed. More specifically, holes (11d) for conductor are formed by irradiating $CO_2$ laser beams or the like from the metal foil (14a) side on portions of resin insulation layer 11 to connect first conductive layer 12 and second conductive layer 14.

Next, metal film such as electroless plated film (not shown) is formed in holes (11d) for conductor and on metal foil (14a), and a resist pattern (not shown) is formed on portions of metal film where no second conductive layer 14 is formed. Then, electroplating, for example, is conducted to form electroplated film (14b) on portions of metal film not covered by the resist pattern. After that, the resist pattern is removed, and the metal film is further etched from portions exposed when the resist pattern is removed. Accordingly, holes (11d) for conductor are filled with electroplated film and metal film (not shown), and via conductors 15 are formed as shown in FIG. 7D. Simultaneously, second conductive layer 14 is formed with metal foil (14a), metal film (not shown) and electroplated film (14b).

Next, carrier 18 is removed as shown in FIG. 7E. To simplify descriptions, only the upper side of carrier 18 in FIG. 7D is inverted in the drawing and is shown in FIG. 7E. As described above, since carrier 18 (carrier metal foil (18*b*)) and metal layer (13*a*) are fixed together using an easy-to-release adhesive agent or the like such as thermoplastic resin, it is easy to strip off the carrier when their temperature is raised or heat is applied thereon. Accordingly, the surface of metal layer (13*a*), which was in contact with carrier metal foil (18*b*), is exposed.

Next, as shown in FIG. 7F, solder mask (19*a*) is formed to be used as the mask for etching predetermined portions of metal layer (13*a*) as described later. Solder mask (19*a*) is formed by the same method as a solder-stripping method, for example, used to make an etching mask for forming circuit patterns on an upper surface of a printed wiring board. More specifically, first, resist film (not shown) is laminated on a surface of metal layer (13*a*) exposed when it is separated from carrier 18. By exposure/development of the resist film, a resist pattern (not shown) is formed, having opening portions (not shown) corresponding to first patterns (12*a*) and covering the rest of metal layer (13*a*). Namely, the resist pattern is formed to cover the entire exposed metal layer (13*a*) while leaving opening portions directly opposite the portions of metal layer (13*a*) facing first patterns (12*a*). The planar shape and size of an opening portion of the resist pattern determines the planar shape and size of metal layer 13 (see FIG. 7G) formed on first conductive layer 12. Therefore, an opening portion of the resist pattern may be set as desired according to the size and positional relationships of metal layer 13 and first pattern (12*a*) such as those shown in FIGS. 2A, 4 and 5 as described earlier. In addition, the size of an opening portion is determined by taking into account that the side surface of metal layer 13 may be etched when metal layer (13*a*) is patterned. Since first patterns (12*a*) are very fine patterns, it is hard to avoid slight positional shifting and size variations of openings. Thus, the structures may accidentally result in those shown in FIGS. 2A and 3~6. However, if the structures shown in FIGS. 2A and 3~6 are not desired, they can be formed otherwise.

Next, in an opening (not shown), namely, on a portion of metal layer (13*a*) corresponding to a first pattern (12*a*), solder-plated film is formed by soldering. The material for solder-plated film is not limited specifically as long as it does not dissolve during the etching of metal layer (13*a*) and works as bonding material for electronic component 30 (see FIG. 7H) after printed wiring board 1 is completed. Examples of solder-plated film are those generally used solder materials such as tin, silver and zinc or their alloys, which do not dissolve in an etching solution that dissolves copper. Next, the resist pattern is removed and solder mask (19*a*) is formed on metal layer (13*a*) to have a predetermined size and planar shape positioned above first patterns (12*a*) as shown in FIG. 7F.

Next, using solder mask (19*a*) as the etching mask, portions of metal layer (13*a*) that are not covered by solder mask (19*a*) are etched away. As described earlier, side surfaces of portions covered by solder mask (19*a*), which are exposed as etching progresses on the portions not covered by solder mask (19*a*), may be etched as the etching process continues further. As a result, metal layer (13*a*) is formed into a pattern where metal layer 13 has substantially the same size as solder mask (19*a*) positioned directly thereon or its side surface is positioned inward from the side surface of solder mask (19*a*) as shown in FIG. 7G. Here, plan views are not shown, but the planar shape of metal layer 13 is formed to be substantially the same as that of solder mask (19*a*). If metal layer (13*a*) is over-etched in a thickness direction, a recess is formed in first pattern (12*a*) as shown in FIG. 6.

In the present embodiment, solder mask (19*a*) is not removed even after metal layer (13*a*) is etched, and remains on metal layer 13 as solder layer 19 as shown in FIG. 7G. Metal layer 13 is formed on first surface (11*a*) of resin insulation layer 11 so as to protrude from the first surface. Moreover, since the number of pads is increasing to have a narrow pitch according to recent trends in specifications for the electrodes of an electronic component, it is significantly difficult to provide metal layer 13 with bonding material for mounting an electronic component after metal layer 13 is patterned. In the present embodiment, since solder mask (19*a*) used for forming (patterning) metal layer 13 remains to work as solder layer 19, theoretically speaking, bonding material is positioned directly on metal layer 13 without performing highly accurate alignment or the like.

Next, solder-resist layer 16 (see FIG. 1) is formed on first surface (11*a*) of resin insulation layer 11 excluding portions around first patterns (12*a*), on second patterns (12*b*), and on second surface (11*b*) of resin insulation layer 11. Solder-resist layer 16 is formed, for example, by forming a layer made of photosensitive epoxy material or the like on both surfaces of resin insulation layer 11 and by patterning the material using a photolithographic technique. Then, surface treatment (not shown) may be conducted on exposed surfaces of second conductive layer 12 by using OSP, Ni/Au, Ni/Pd/Au, Sn or the like. Accordingly, printed wiring board 1 shown in FIG. 1 is completed.

As shown in FIG. 7H, electronic component 30 is mounted on the completed printed wiring board 1, by connecting electrodes 31 of electronic component 30 to first patterns (12*a*) of first conductive layer 12 through metal layer 13. In printed wiring board 1 of the present embodiment, solder layer 19 is formed on metal layer 13 and works as bonding material, thus enabling electronic component 30 to be mounted, omitting a process for forming solder balls or supplying bonding material such as solder onto metal layer 13. Especially, it is thought to be a difficult procedure to supply bonding material onto metal layer 13, which is formed to protrude from first surface (11*a*) of resin insulation layer 11 and is patterned at a narrow pitch. However, such a difficult procedure is omitted according to the present embodiment.

The embodiment shown in FIG. 1 shows an example where a printed wiring board is provided with a pair of conductive layers (first conductive layer 12 and second conductive layer 14) to sandwich a single-layered resin insulation layer. However, that is not the only option. For example, after second conductive layer 14 is formed as shown in FIG. 7D, on second conductive layer 14 and on the exposed surface of resin insulation layer 11, a second resin insulation layer and a second metal layer may further be laminated the same as shown in FIG. 7C, followed by a step shown in FIG. 7E and subsequent steps, so that a triple-layered printed wiring board is formed. Moreover, a printed wiring board may be formed to have four or more layers by repeating those steps one more time or multiple times.

As described so far, according to the present embodiment, solder mask (19*a*) is formed as the etching mask for patterning metal layer 13 and remains on metal layer 13 to become solder layer 19 to work as material for bonding an electronic component, thereby omitting a step for further supplying such bonding material. In addition, without causing positional shifting and without conducting complex procedures such as high-accuracy alignment, bonding material for mounting an electronic component is supplied on metal layer 13 which protrudes from first surface (11*a*) of resin insulation layer 11. Accordingly, the manufacturing procedures for a printed wiring board and an electronic device that uses the printed wiring board are significantly simplified and the cost of manufacturing is significantly reduced.

A solder-resist layer may be formed on a surface of a printed wiring board. When a conductive layer is embedded only on one side of an insulation layer, solder-resist layers respectively formed on both surfaces tend to have different thicknesses. Accordingly, a wiring board is likely to warp as its ambient temperature changes. When a wiring board warps, stress is exerted on bonded portions with the electronic component mounted on a surface of the wiring board. As a result, repeated temperature changes cause the bonded portions to deteriorate, and connection reliability is lowered. If the ball diameter of solder balls is increased for the purpose of absorbing such stress, adjacent solder balls may be highly likely to short circuit. In a method for forming solder balls and the like on the electrodes formed on predetermined positions, procedures tend to be complex, since a step for accurately aligning the electrodes and solder balls is conducted in addition to a step for providing solder balls and the like.

A printed wiring board according to an embodiment of the present invention is capable of maintaining excellent connection with a mounted electronic component for a long period of time even when a conductive layer is embedded only on one side of an insulation layer, and of accurately providing bonding material on electrodes by employing a simplified process. Another embodiment of the present invention is a method for manufacturing such a printed wiring board.

A printed wiring board according to an aspect of the present invention is provided with the following: a resin insulation layer having a first surface and a second surface opposite the first surface; a first conductive layer embedded in the resin insulation layer in a way to expose its uppermost surface on the first surface; a second conductive layer formed to protrude from the second surface of the resin insulation layer; via conductors penetrating through the resin insulation layer and electrically connecting the first conductive layer and the second conductive layer; a solder-resist layer formed on the first surface of the resin insulation layer and on the first conductive layer and having an opening to expose portions of the first conductive layer so that the exposed portions work as pads for mounting an electronic component; and a metal layer formed on the first conductive layer exposed in the opening and protruding from the first surface. A solder layer with a flat surface is formed on the metal layer.

A method for manufacturing a printed wiring board according to another aspect of the present invention includes the following: preparing a carrier having a metal layer on its entire surface; on the metal layer, forming a first conductive layer that includes pads for mounting an electronic component; laminating a resin insulation layer and a metal foil on the metal layer and on the first conductive layer; forming holes for conductor that penetrate through the metal foil and the resin insulation layer and expose the first conductive layer; forming a second conductive layer that includes the metal foil and filling the holes for conductor with a conductive material; removing the carrier and exposing a surface of the metal layer; forming a solder layer on the metal layer positioned on the pad portions for mounting an electronic component; etching away portions of the metal layer by using the solder layer as a mask; and forming a solder-resist layer on the first surface of the resin insulation layer and on the first conductive layer where no metal layer is formed.

In a printed wiring board according to an embodiment of the present invention, a metal layer is formed to protrude from a first surface of a resin insulation layer; the metal layer is positioned on pads for mounting an electronic component, which are portions of a first conductive layer embedded on the first surface side. When the printed wiring board warps, the metal layer contributes to mitigating the stress exerted on portions bonded with a mounted electronic component. Thus, an earlier-stage deterioration of the bonded portions is prevented, and connection reliability with the electronic component is enhanced. In addition, since a solder layer is formed on the metal layer, a process for supplying solder material for mounting an electronic component may be omitted. According to the method for manufacturing a printed wiring board, on the pads for mounting an electronic component, a solder layer is formed to be used as a mask for etching the metal film. Thus, the solder layer can also be used as a bonding material, and a step for providing solder balls or the like is omitted accordingly. Moreover, since the solder mask formed as the etching mask for the metal film is used as the solder layer on the metal layer, forming a bonding layer is simplified while alignment with the metal layer is achieved.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    a resin insulation layer;
    a first conductive layer formed on a first-surface side of the resin insulation layer such that the first conductive layer is embedded into a first surface of the resin insulation layer and has a surface exposed on the first surface of the resin insulation layer;
    a second conductive layer formed on a second-surface side of the resin insulation layer such that the second conductive layer is formed on a second surface of the resin insulation layer and is protruding from the second surface of the resin insulation layer;
    a via conductor formed in the resin insulation layer such that the via conductor is penetrating through the resin insulation layer and electrically connecting the first conductive layer and the second conductive layer;
    a solder-resist layer formed on the first surface of the resin insulation layer such that the solder-resist layer is covering the first conductive layer and has an opening structure forming an exposed structure of the first conductive layer; and
    a metal layer formed on the exposed structure of the first conductive layer such that the metal layer is protruding from the first surface of the resin insulation layer,
    wherein the exposed structure of the first conductive layer comprises a plurality of pads positioned to mount an electronic component to the first conductive layer, and the metal layer has a solder layer formed on the metal layer and having a flat surface and has a side surface formed such that at least a portion of the side surface is receded inward with respect to a side surface of the solder layer.

2. A printed wiring board according to claim 1, wherein the metal layer is one of a copper foil and a nickel foil, and the first conductive layer is an electrolytic copper plated film.

3. A printed wiring board according to claim 2, wherein the metal layer is formed on the surface of the first conductive layer such that the metal layer has an entire surface facing the first conductive layer in contact with the pads of the first conductive layer.

4. A printed wiring board according to claim 2, wherein the metal layer is formed on the surface of the first conductive layer such that the metal layer has a surface facing the first conductive layer and having a plurality of portions in contact with the pads of the first conductive layer, respectively.

5. A printed wiring board according to claim 2, wherein the metal layer is formed on the surface of the first conductive layer such that the metal layer has a surface facing the first conductive layer and having a plurality of portions in contact with the pads of the first conductive layer, respectively, and covering an entire surface of the exposed structure of the first conductive layer.

6. A printed wiring board according to claim 2, wherein the metal layer has a thickness which is less than a thickness of the solder-resist layer.

7. A printed wiring board according to claim 1, wherein the metal layer is formed on the surface of the first conductive layer such that the metal layer has an entire surface facing the first conductive layer in contact with the pads of the first conductive layer.

8. A printed wiring board according to claim 7, wherein the pads of the first conductive layer have recessed surface portions around the metal layer, respectively.

9. A printed wiring board according to claim 8, wherein the metal layer is one of a copper foil and a nickel foil, and the first conductive layer is an electrolytic copper plated film.

10. A printed wiring board according to claim 1, wherein the metal layer is formed on the surface of the first conductive layer such that the metal layer has a surface facing the first conductive layer and having a plurality of portions in contact with the pads of the first conductive layer, respectively.

11. A printed wiring board according to claim 1, wherein the metal layer is formed on the surface of the first conductive layer such that the metal layer has a surface facing the first conductive layer and having a plurality of portions in contact with the pads of the first conductive layer, respectively, and covering an entire surface of the exposed structure of the first conductive layer.

12. A printed wiring board according to claim 1, wherein the metal layer has a thickness which is less than a thickness of the solder-resist layer.

13. A printed wiring board according to claim 1, wherein the solder layer has an upper surface which is positioned lower than an upper surface of the solder-resist layer.

14. A printed wiring board according to claim 1, wherein the solder layer has an upper surface which is positioned higher than an upper surface of the solder-resist layer.

15. A printed wiring board according to claim 1, wherein the metal layer comprises a plurality of laminated metal layers.

16. A printed wiring board according to claim 1, wherein the opening structure of the solder-resist layer comprises an opening portion exposing the plurality of pads.

17. A printed wiring board according to claim 1, wherein the opening structure of the solder-resist layer comprises a plurality of opening portions exposing the plurality of pads, respectively.

18. A printed wiring board according to claim 1, wherein the metal layer comprises a plurality of laminated metal layers selected from the group consisting of a Cu/Ni structure, a Cu/Ti structure, a Au/Pd/Ni structure and a Au/Ni structure.

19. A method for manufacturing a printed wiring board, comprising:
   forming a first conductive layer on a metal layer formed on an entire surface of a carrier such that the first conductive layer has a plurality of pads positioned to mount an electronic component;
   laminating a resin insulation layer and a metal foil on the metal layer such that the resin insulation layer covers the first conductive layer;
   forming a hole for a via conductor in the resin insulation layer such that the hole penetrates through the metal foil and the resin insulation layer and exposes a portion of the first conductive layer;
   forming a second conductive layer comprising the metal foil such that the hole is filled with a conductive material;
   removing the carrier from the metal layer such that a surface of the metal layer is exposed;
   forming a solder layer on the metal layer positioned on the plurality of pads of the first conductive layer;
   etching away a portion of the metal layer by using the solder layer as a mask; and
   forming a solder-resist layer on the first surface of the resin insulation layer such that the solder-resist layer has an opening structure forming an exposed structure comprising the plurality of pads of the first conductive layer.

20. A method for manufacturing a printed wiring board according to claim 19, wherein the forming of the solder layer comprises forming a plate resist layer on the metal layer such that the plate resist layer has openings exposing portions of the metal layer corresponding to the pads, respectively, and applying solder material to the metal layer by a plating method such that the solder layer is formed on the portions of the metal layer positioned on the pads, respectively.

* * * * *